(12) United States Patent
Pinto et al.

(10) Patent No.: US 10,184,986 B2
(45) Date of Patent: Jan. 22, 2019

(54) SYSTEM FOR CONDITION MONITORING OF ELECTRIC MACHINE, MOBILE PHONE AND METHOD THEREOF

(71) Applicant: ABB Schweiz AG, Zurich (CH)

(72) Inventors: Cajetan Pinto, Mumbai (IN); Maciej Orman, Shanghai (CN); Prasad Mulay, Maharashtra (IN)

(73) Assignee: ABB Schweiz AG, Baden (CH)

( * ) Notice: Subject to any disclaimer, the term of this patent is extended or adjusted under 35 U.S.C. 154(b) by 196 days.

(21) Appl. No.: 15/196,858

(22) Filed: Jun. 29, 2016

(65) Prior Publication Data

US 2016/0306012 A1 Oct. 20, 2016

Related U.S. Application Data

(63) Continuation of application No. PCT/EP2014/059994, filed on May 15, 2014.

(51) Int. Cl.
*G01R 31/34* (2006.01)
*G01R 29/08* (2006.01)
(Continued)

(52) U.S. Cl.
CPC ....... *G01R 31/343* (2013.01); *G01R 29/0814* (2013.01); *G01R 33/04* (2013.01); *G01R 33/10* (2013.01)

(58) Field of Classification Search
CPC ...... G01R 31/343; G01R 33/04; G01R 33/10; G01R 29/814
See application file for complete search history.

(56) References Cited

U.S. PATENT DOCUMENTS 2,689,331 A 9/1954 Boyce et al.
3,506,914 A 4/1970 Albright et al.
(Continued)

FOREIGN PATENT DOCUMENTS

CN 101277052 A 9/2011
EP 0181775 A1 5/1986
(Continued)

OTHER PUBLICATIONS

European Patent Office, International Search Report & Written Opinion issued in corresponding Application No. PCT/EP2014/059994, dated Oct. 1, 2014, 10 pp.
(Continued)

*Primary Examiner* — Tung X Nguyen
*Assistant Examiner* — Dominic Hawkins
(74) *Attorney, Agent, or Firm* — Taft Stettinius & Hollister LLP

(57) ABSTRACT

It is proposed a system for condition monitoring electric machine and the method thereof. The system includes a portable unit, being adapted for free movement around said electric machine; a magnetic field sensor, being adapted for measuring magnetic field intensity at at least one of a plurality points of a path of said free movement; a processing unit, being adapted for receiving at least one corresponding magnetic field intensity signal from said magnetic field sensor, comparing at least one magnetic field intensity value to at least one corresponding expected value, and determining, based on the comparison, if a fault is present in the electric machine; wherein: said magnetic field sensor and said processing unit are integrated into said portable unit. And the method includes steps of moving said portable unit to at least one point of a plurality points of a path of said free movement around said electric machine; measuring at least one magnetic field intensity at said at least one of a plurality
(Continued)

points of a path of said free movement; and comparing at least one magnetic field intensity value to at least one corresponding expected value, and determining, based on the comparison, if a fault is present in the electric machine.

15 Claims, 3 Drawing Sheets

(51) Int. Cl.
  *G01R 33/04* (2006.01)
  *G01R 33/10* (2006.01)

(56) References Cited

U.S. PATENT DOCUMENTS

| | | | |
|---|---|---|---|
| 6,466,009 B1* | 10/2002 | Dehaan | G01R 33/028 310/184 |
| 7,880,473 B2 | 2/2011 | Chari et al. | |
| 2005/0093536 A1 | 5/2005 | Lee et al. | |
| 2008/0266880 A1 | 10/2008 | Nishikawa | |
| 2009/0243647 A1 | 10/2009 | Chari et al. | |
| 2010/0311494 A1* | 12/2010 | Miller | A63F 1/18 463/22 |
| 2011/0191034 A1* | 8/2011 | Lee | G01R 31/343 702/35 |
| 2013/0234752 A1 | 9/2013 | Jaszcar et al. | |

FOREIGN PATENT DOCUMENTS

| | | |
|---|---|---|
| GB | 692659 A | 6/1953 |
| GB | 2457590 A | 8/2009 |

OTHER PUBLICATIONS

D. Belkhayat, R. Romary, M. EL. Adnani, R. Corton and J.F. Brundy, Fault Diagnosis in Induction Motors Using Magnetic Field Measurement with an Antenna, IOPscience, 2003 Meas. Sci. Technol. 14, pp. 1695 to 1700.

Andrian Ceban, Remus Pusca and Raphael Romary, Study of Rotor Faults in Induction Motors Using External Magnetic Field Analysis, IEEE Transactions on Industrial Electronics, vol. 59, No. 5, May 2012, pp. 2082 to 2093.

Chinese Office Action, Chinese Patent Application No. 201480071979, dated Feb. 12, 2018, 19 pages with English Translation.

Chinese Search Report, Chinese Patent Application No. 201480071979, dated Feb. 12, 2018, 4 pages with English Translation.

* cited by examiner

SYSTEM FOR CONDITION MONITORING OF ELECTRIC MACHINE, MOBILE PHONE AND METHOD THEREOF

TECHNICAL FIELD

The invention relates to the field of condition monitoring of electric machine.

BACKGROUND ART

For the purpose of detecting motor fault many diagnostic methods have been developed so far. These methods to identify the induction machine faults may involve several different types of fields of science and technology. The most popular methods are:
- temperature measurements;
- infrared recognition;
- noise and vibration monitoring;
- chemical analysis;
- acoustic noise measurements;
- motor current signature analysis.

Among them, the most widely uses in industry are vibration monitoring and current signature analysis. All of the above method required sensors for performing measurements and subsequent analysis. By traditional measurements of current or vibration actually not the root of the problem is detected but the consequences of magnetic flux leakage which often can lead to misinterpretation of results. In other words, in terms of the condition monitoring of electric machine, such as electric motor and electric generator, the electric machine's condition inferred from the measurement of the current or vibration of the electric machine is less accurate than that from the measurement of the magnetic field leakage of the rotor.

Besides, typically to perform condition monitoring of electric machine it is necessary to install sensors on electric machine and use data collector to measure respective signals. Such approach is expensive. Sensors and data collectors might already be expensive however additional cost is related with installation of sensors on the electric machine if customer does not have his own sensors and data collectors.

BRIEF SUMMARY OF THE INVENTION

It is therefore an objective of the invention to provide a system for condition monitoring electric machine and the method thereof. The system includes a portable unit, being adapted for free movement around said electric machine; a magnetic field sensor, being adapted for measuring magnetic field intensity at at least one of a plurality points of a path of said free movement; a processing unit, being adapted for receiving at least one corresponding magnetic field intensity signal from said magnetic field sensor, comparing at least one magnetic field intensity value to at least one corresponding expected value, and determining, based on the comparison, if a fault is present in the electric machine; wherein: said magnetic field sensor and said processing unit are integrated into said portable unit. And the method includes steps of moving said portable unit to at least one point of a plurality points of a path of said free movement around said electric machine; measuring at least one magnetic field intensity at said at least one of a plurality points of a path of said free movement; and comparing at least one magnetic field intensity value to at least one corresponding expected value, and determining, based on the comparison, if a fault is present in the electric machine.

By having the system above and the method thereof, to perform condition monitoring of electric machine, the operator can hold the portable unit next to the electric machine where conventional magnetic field sensor cannot be installed and where rotor magnetic field leakage is present, either axial or radial. The magnetic field leakage can be measured at a position where installation of magnetic field sensor on the electric machine is restricted due to mechanical or electrical limitation. Besides, it makes the result more accurate by condition monitoring electric machine's magnetic field leakage directly and determining the electric machine's condition accordingly. By measuring magnetic field instead of current or vibration not only whole analysis can be performed just with the condition monitoring system but by measuring magnetic field the root of the problem is measured directly.

It is another objective of the invention to provide a mobile phone which includes the system for condition monitoring electric machine and using method thereof. By reusing the mobile phone as the condition monitoring system, no additional cost will incur for purchasing a magnetic field sensor and processing unit.

It is another objective of the invention to provide an alarm device for generating warning signal in response where said processing unit determined a fault present in the electric machine.

According to another objective of the invention, a first point of said plurality points of said path of said free movement is located in area where an axial magnetic flux leakage is present around said electric machine; said portable unit is adapted to move to said first point; and said magnetic field sensor is adapted to measure the magnetic field intensity for said axial magnetic flux leakage present at the first point. Thus, it is easier to move the portable unit into a place where it is hard to mount the sensor and measure the rotor magnetic field leakage therein. Further according to the objective of the invention, a second point of said plurality points of said path of said free movement is located in area where a radial magnetic flux leakage is present around said electric machine; said portable unit is adapted to move to said second point; and said magnetic field sensor is adapted to measure the magnetic field intensity for said radial magnetic flux leakage present at the second point; said processing unit is adapted for comparing said magnetic field intensity signals for said axial magnetic flux leakage and said radial magnetic flux leakage and determining a type of said fault.

According to another objective of the invention, a second point of said plurality points of said path of said free movement is located in area where a radial magnetic flux leakage is present around said electric machine; said portable unit is adapted to move to said second point; and said magnetic field sensor is adapted to measure the magnetic field intensity for said radial magnetic flux leakage present at the second point. Thus, it is easier to move the portable unit into a place where it is hard to mount the sensor and measure the rotor magnetic field leakage therein.

BRIEF DESCRIPTION OF THE DRAWINGS

The subject matter of the invention will be explained in more detail in the following text with reference to preferred exemplary embodiments which are illustrated in the drawings, in which.

The reference symbols used in the drawings, and their meanings, are listed in summary form in the list of reference symbols. In principle, identical parts are provided with the same reference symbols in the figures.

PREFERRED EMBODIMENTS OF THE INVENTION

Figure 1:
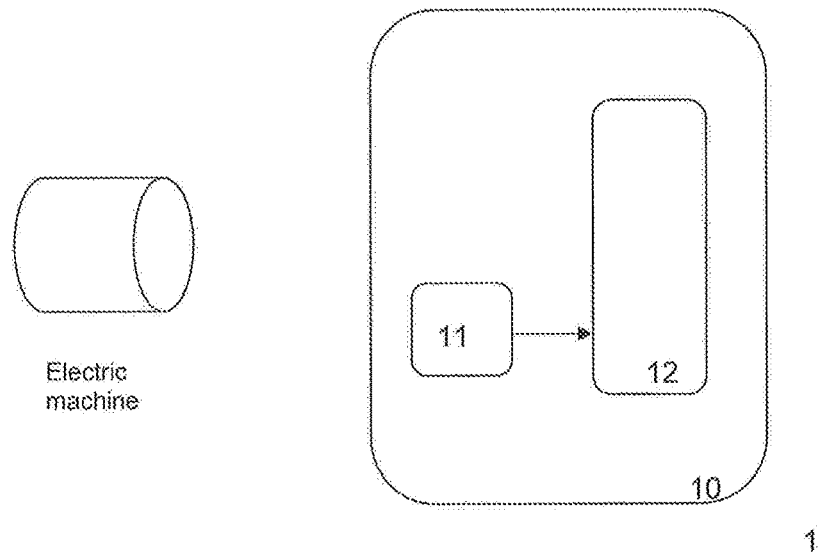
FIG. 1 is a block diagram of a system for a system for condition monitoring an electric machine.

FIG. 1 is a block diagram of a system for a system for condition monitoring an electric machine. The system according to FIG. 1 is designated with 1 in its entirety. As shown in FIG. 1, the system 1 includes a portable unit 10, a magnetic field sensor 11 and a processing unit 12. The magnetic field sensor 11 and the processing unit 12 are integrated into the portable unit 10. The portable unit 10 is movable with freedom with respect to the electric machine, for example in linear movement, in circular movement, in forward and backward movement, and so on. The portable unit 10 can be any device, such as a mobile phone and other electronics devices; for example, processing unit and magnetic field sensor are embedded in the contemporary mobile phone to distinguish healthy machine from the one with broken rotor bar or rotor misalignment, by that no additional hardware except mobile phone is required; contemporary mobile phones such as iphone (3, 4 and 5) or Samsung Galaxy got embedded magnetic field sensor which can measure magnetic field with resolution of 0.1 µT, range 2 kµT and sampling frequency of 120 Hz; those parameters are slightly changing on different mobile phone models. By using mobile phone for performing flux measurements no other additional sensors, data collectors or data processing tool is required, and all data acquisition and processing can be done on mobile phone. The presence of broken rotor bar or end ring causes an unbalance to the rotor magnetic flux, as the current cannot flow through the broken or cracked bar/end-ring. The unbalanced rotor flux can be considered as the combination of positive- and negative-sequence rotor flux, rotating at slip frequency in the opposite directions. This results in modulation of current which can be visible in spectrum as a twice slip sidebands around line frequency. However, in practice, the current sidebands around the fundamental may exist even when the electric machine is healthy. This could be due to uneven rotor bar resistance because of the die-casting process, rotor asymmetry, external load oscillations etc. According to an embodiment of present invention, the integrated magnetic field sensor 11 is utilized to measure the magnetic flux leakage of the rotor in case of broken rotor bar or rotor misalignment. When the portable unit 10 moves around the electric machine, the magnetic field sensor 11 integrated therein can measure a magnetic field intensity at at least one of a plurality points of a path of the portable unit 10's free movement, and the skilled person should understand that any path consists of a multiple of points linking together. The processing unit 12 can receive at least one corresponding magnetic field intensity signal from the magnetic sensor 1 compare at least one magnetic field intensity value to at least one corresponding expected value, and determining, based on the comparison, if a fault is present in the electric machine. This will be described in detail hereafter in examples with illustration of figures.

By having the system above, to perform condition monitoring of electric machine, the operator can hold the portable unit next to the electric machine where conventional magnetic field sensor cannot be installed and where rotor magnetic field leakage is present, either axial or radial. The magnetic field leakage can be measured at a position where installation of magnetic field sensor on the electric machine is restricted due to mechanical or electrical limitation.

Besides, it makes the result more accurate by condition monitoring electric machine's magnetic field leakage directly and determining the electric machine's condition accordingly. By measuring magnetic field instead of current or vibration not only whole analysis can be performed just with the condition monitoring system but by measuring magnetic field the root of the problem is measured directly.

Finally, by reusing the mobile phone as the condition monitoring system, no additional cost will incur for purchasing a magnetic field sensor and processing unit.

Figure 2:
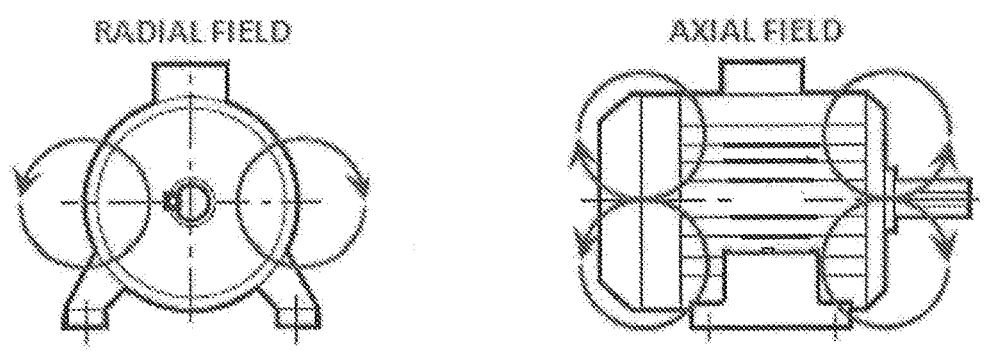
FIG. 2 shows a section view of the magnetic field around an electric machine.

FIG. 2 shows a section view of the magnetic field around an electric machine. As shown in FIG. 2, the magnetic field around the electric machine can be categorized in two cases, radial field and axial field. The axial field is in a plan which includes the electric machine axis; it is generated by currents in the stator end windings or rotor cage end ring. The radial field is located in a plane perpendicular to the electrical axis, it is an image of the air-gap flux density which is attenuated by the stator magnetic circuit (package of laminations) and by the external machine frame. The both fields can be measured separately by a convenient location of the magnetic field sensor 11 integrated in the portable unit 10. Since broken rotor bars of the electric machine are causing axial magnetic flux leakage it makes sense to make the measurements of magnetic axial field intensity. In addition, since rotor misalignment of the electric machine is causing radial magnetic flux leakage it makes sense to make the measurements of magnetic radial field intensity.

Figure 3:
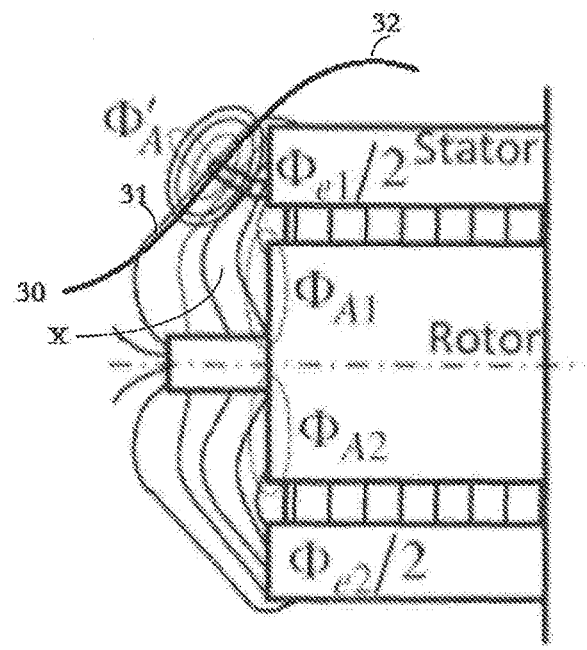
FIG. 3 illustrates a path in which the portable unit according to an embodiment of present invention moves with respective to the electric machine.

FIG. 3 illustrates a path in which the portable unit according to an embodiment of present invention moves with respective to the electric machine. As shown in FIG. 3, the path 30 consists of a multiple of points linking together. For example, a first point 31 of the multiple of points of the path is located in the area where an axial magnetic flux leakage is present around the electric machine, a second point 32 of the multiple points of the path of is located in area where a radial magnetic flux leakage is present around the electric machine. The portable unit 10 can move to the first point 31 or the second point 32 from another point along the path 30, or can move between the first point 31 and the second point 32 along the path 30. The skilled person should understand that the first point 31 and the second point 32 are only for example indicating locations in the areas of an axial magnetic flux leakage and a radial magnetic flux leakage, and the path 30 is for example of the possible route of the portable unit. The skilled person should understand that there is some area of the electric machine on which it is difficult to install the magnetic field sensor, for example in the space X between the end of the rotor and the stator, or where it is difficult to install the magnetic field sensor on the output end of the rotor where the output end of the rotor is mechanically linked to a shaft. With the system according to an embodiment of present invention, it is easier to move the portable unit into such place and measure the rotor magnetic field leakage therein. With the various locations attic portable unit 10, for example at the first point 31 or at the second point 32, the magnetic field sensor. 11 integrated in the portable unit 10 can measure the axial magnetic field intensity for axial magnetic flux leakage at the first point 31 or measure the radial magnetic field intensity for radial magnetic flux leakage at the second point 32. The processing unit 12 integrated in the portable unit 10 can receive the magnetic field intensity signal representing the axial magnetic field leakage at the first point 31 from the magnetic field sensor 11 integrated in the portable unit 10, and/or receive the magnetic field intensity signal representing the radial magnetic field leakage at the first point 32 from the magnetic field sensor 11 integrated in the portable unit 10, and can compare the received magnetic field intensity value to expected value and determine based on the comparison if a fault is present in the electric machine. The process of comparison and determination by the processing unit 12 will be described in example with figures hereafter.

Based on FEM (Finite Element Method) analysis, magnetic flux leakage should be visible in low frequency of magnetic field spectrum as given by equation (1):

$$f_b = s * f_{line} \tag{1}$$

where $f_b$ is frequency related to broken rotor bar, $f_{line}$ is power supply frequency and s is slip.

Figure 4A:
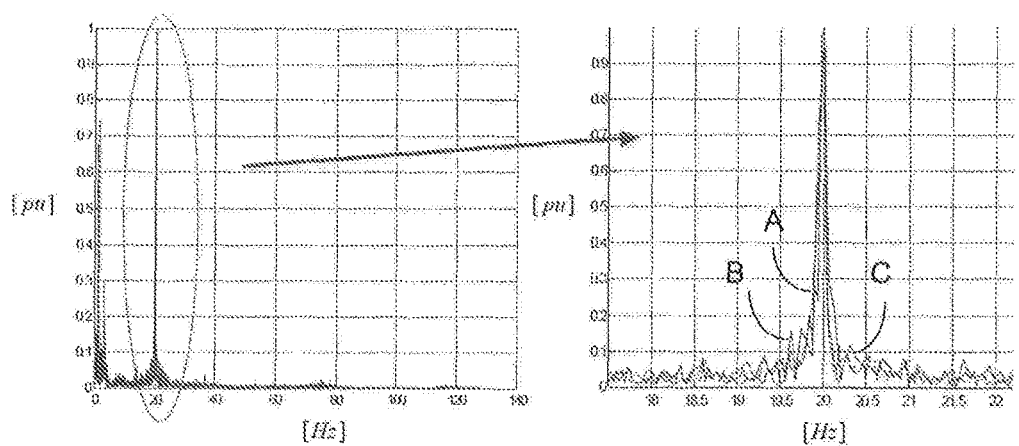
FIG. 4A shows the spectrum of axial magnetic field leakage of a healthy electric machine.

FIG. 4A shows the spectrum of axial magnetic field leakage of a healthy electric machine, and two cases of electric machine with broken rotor bar. All cases were supplied with 20 Hz and for all cases 20 Hz is dominant frequency visible in magnetic field spectrum. Spectrum was normalized to 1 therefore the units is [pu]. As shown in FIG. 4A, the spectrum on the right is a zoom view of the circled portion of the left around the dominant frequency 20 Hz, where the curve representing the axial magnetic field leakage of the healthy electric machine is designated with A, the curves for the two cases of the broken rotor bar are designated with B and C.

Figure 4B:
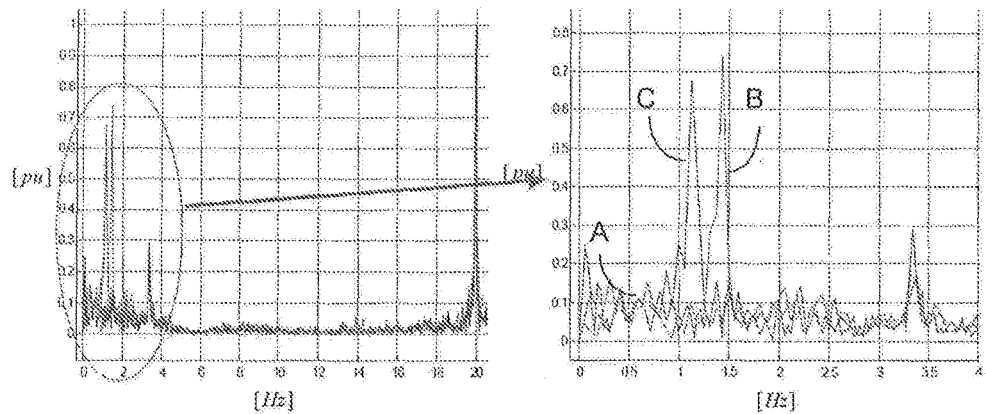
FIG. 4B shows the lower frequency portion of FIG. 4A.

FIG. 4B shows the lower frequency portion of FIG. 4A. As shown in FIG. 4B, the spectrum on the right is a zoom view of the circled portion of the left. For healthy case the electric machine was operated at full load and respective broken rotor bar frequency fb should appear in 0.67 Hz. As it is visible in FIG. 4B, in case of healthy electric machine (curve A), there is no peak which can be easily separate from noise at broken rotor bar frequency fb. For the broken rotor bar motor operating at full load respective fb frequency should be at 1.45 Hz. As it is clearly visible in FIG. 4B this frequency (curve B) is dominant in low frequency range and it is equal to 0.72 of line frequency. For the broken rotor bar motor operating at 50% load respective fb frequency should be at 1.16 Hz. Same as for full load case fb frequency is clearly visible in FIG. 4B (curve C), this frequency is also dominant in low frequency range and it is around 0.68 of line frequency. What is also worth mentioning is that amplitude of fb frequency is smaller for smaller load which can be explained by the fact that for lower load there is smaller rotor current which is producing smaller magnetic field.

Figure 5:
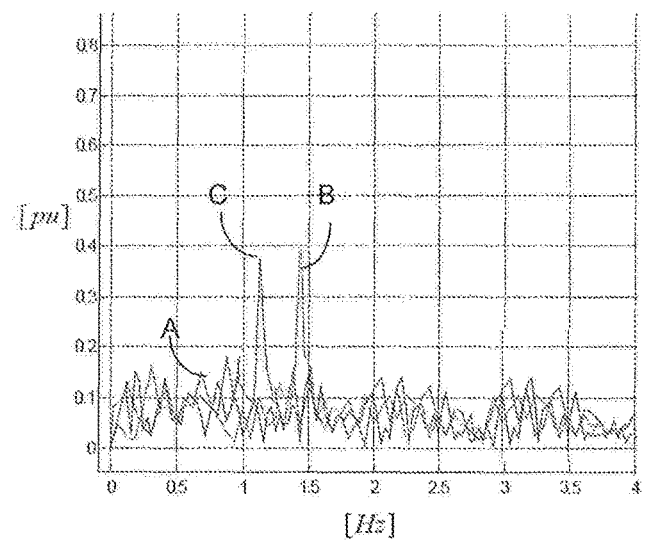
FIG. 5 shows the low frequency spectrum of radial magnetic field leakage of a healthy electric machine, and two cases of electric machine with broken rotor bar.

FIG. 5 shows the low frequency spectrum of radial magnetic field leakage of a healthy electric machine, and two cases of electric machine with broken rotor bar. Same as in FIG. 4 all cases were supplied with 20 Hz and for all cases 20 Hz is dominant frequency which was not shown in FIG. 5. Spectrum was normalized to 1 therefore the units is [pu]. For healthy case the electric machine was operated at full load and respective broken rotor bar frequency fb should appear in 0.67 Hz. As it is visible in FIG. 5, in case of healthy electric machine (curve A), there is no peak which can be easily separate from noise at broken rotor bar frequency fb. For the broken rotor bar motor operating at full load respective fb frequency should be at 1.45 Hz. As it is clearly visible in FIG. 5 this frequency (curves B) is dominant in low frequency range and it is equal to 0.4 of line frequency. For the broken rotor bar motor operating at 50% load respective fb frequency should be at 1.16 Hz. Same as for full load case fb frequency is clearly visible in FIG. 5, this frequency is also dominant in low frequency range and it is around 0.38 of line frequency. What is also worth mentioning is that amplitude of fb frequency is smaller in radial magnetic field than respective amplitude fb frequency in axial magnetic field which confirms broken rotor bar. If amplitude of fb frequency in radial magnetic field is larger than amplitude of fb frequency in axial magnetic field then motor fault type is misalignment not broken rotor bar.

The system 1 can further include an alarm device for generating warning signal in response where said processing unit determined a fault present in the electric machine.

By using the system as described above, a method for condition monitoring electric machine is describe hereafter. The method includes: in step S1, moving said portable unit to at least one point of a plurality points of a path of said free movement around said electric machine, in step S2, measuring at least one magnetic field intensity at said at least one of a plurality points of a path of said free movement; in step S3, comparing at least one magnetic field intensity value to at least one corresponding expected value, and determining, based on the comparison, if a fault is present in the electric machine.

Preferably, the method further includes: in step S4, generating warning signal in response to that fault was determined to be present in the electric machine.

Step S1 may have variants as:
i. a first point of said plurality points of said path of said free movement is located in area where an axial magnetic flux leakage is present around said electric machine; moving said portable unit can move to said first point; and
measuring the magnetic field intensity for said axial magnetic flux leakage present at the first point.
ii. a second point of said plurality points of said path of said free movement is located in area where a radial magnetic flux leakage is present around said electric machine;
moving said portable unit can move to said second point; and
measuring the magnetic field intensity for said radial magnetic flux leakage present at the second point.
iii. in combination of variant i,
a second point of said plurality points of said path of said free movement is located in area where a radial magnetic flux leakage is present around said electric machine;
moving said portable unit can move to said second point;
measuring the magnetic field intensity for said radial magnetic flux leakage present at the second point; and
comparing said magnetic field intensity signals for said axial magnetic flux leakage and said radial magnetic flux leakage and determining a type of said fault.

Preferably in step S3, said magnetic field intensity value is an amplitude of frequency component of said magnetic field intensity.

Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore tall in the scope of the present invention which is defined by the accompanied claims.

The invention claimed is:

1. A system for condition monitoring electric machine, including:
   a portable unit, being adapted for free movement around said electric machine;
   a magnetic field sensor, being adapted for measuring magnetic field intensity at at least one of a plurality points of a path of said free movement;
   a processing unit, being adapted for receiving at least one corresponding magnetic field intensity signal from said magnetic field sensor, comparing at least one magnetic field intensity value to at least one corresponding expected value, and determining, based on the comparison if a fault is present in the electric machine;
   wherein:
   said magnetic field sensor and said processing unit are integrated into said portable unit;
   a first point of said plurality of points of said path of said free movement is located in area where an axial magnetic flux leakage is present around said electric machine;
   a second point of said plurality points of said path of said free movement is located in area where a radial magnetic flux leakage is present around said electric machine;
   said portable unit is adapted to move to said first point;
   said magnetic field sensor is adapted to measure the magnetic field intensity for said axial magnetic flux leakage present at the first point;
   said portable unit is adapted to move to said second point;
   said magnetic field sensor is adapted to measure the magnetic field intensity for said radial magnetic flux leakage present at the second point; and
   said processing unit is adapted for comparing said magnetic field intensity signals for said axial magnetic flux leakage and said radial magnetic flux leakage and determining a type of said fault.

2. The system according to claim 1, further including:
   an alarm device, being adapted for generating warning signal in response where said processing unit determined a fault present in the electric machine.

3. The system according to claim 1, wherein:
   a second point of said plurality points of said path of said free movement is located in area where a radial magnetic flux leakage is present around said electric machine;
   said portable unit is adapted to move to said second point; and
   said magnetic field sensor is adapted to measure the magnetic field intensity for said radial magnetic flux leakage present at the second point.

4. The system according to claim 1, wherein:
   said magnetic field intensity value is an amplitude of frequency component of said magnetic field intensity.

5. The system according to claim 2, wherein:
   a second point of said plurality points of said path of said free movement is located in area where a radial magnetic flux leakage is present around said electric machine;
   said portable unit is adapted to move to said second point; and
   said magnetic field sensor is adapted to measure the magnetic field intensity for said radial magnetic flux leakage present at the second point.

6. The system according to claim 2, wherein:
   said magnetic field intensity value is an amplitude of frequency component of said magnetic field intensity.

7. The system according to claim 3, wherein:
   said magnetic field intensity value is an amplitude of frequency component of said magnetic field intensity.

8. A method for condition monitoring electric machine, including:
   providing a system including:
      providing a system for condition monitoring of an electric machine, the system comprising:
         a portable unit, being adapted for free movement around said electric machine;
         a magnetic field sensor, being adapted for measuring magnetic field intensity at at least one of a plurality points of a path of said free movement;
         a processing unit, being adapted for receiving at least one corresponding magnetic field intensity signal from said magnetic field sensor, comparing at least one magnetic field intensity value to at least one corresponding expected value, and determining, based on the comparison, if a fault is present in the electric machine:
   moving said portable unit to at least one point of a plurality points of a path of said free movement around said electric machine;
   measuring at least one magnetic field intensity at said at least one of a plurality points of a path of said free movement;
   comparing at least one magnetic field intensity value to at least one corresponding expected value, and determining, based on the comparison, if a fault is present in the electric machine;
   a first point of said plurality points of said path of said free movement is located in area where an axial magnetic flux leakage is present around said electric machine;
   a second point of said plurality points of said path of said free movement is located in area where a radial magnetic flux leakage is present around said electric machine;
   moving said portable unit can move to said first point;
   measuring the magnetic field intensity for said axial magnetic flux leakage present at the first point;
   moving said portable unit can move to said second point;
   measuring the magnetic field intensity for said radial magnetic flux leakage present at the second point; and
   comparing said magnetic field intensity signals for said axial magnetic flux leakage and said radial magnetic flux leakage and determining a type of said fault.

9. The method according to claim 8, further including:
   generating warning signal in response to that fault was determined to be present in the electric machine.

10. The method according to claim 8, wherein;
    a second point of said plurality points of said path of said free movement is located in area where a radial magnetic flux leakage is present around said electric machine;
    further including:
    moving said portable unit can move to said second point; and
    measuring the magnetic field intensity for said radial magnetic flux leakage present at the second point.

11. The method according to claim 8, wherein:
said magnetic field intensity value is an amplitude of frequency component of said magnetic field intensity.

12. The method according to claim 9, wherein:
a second point of said plurality points of said path of said free movement is located in area where a radial magnetic flux leakage is present around said electric machine;
further including:
moving said portable unit can move to said second point; and
measuring the magnetic field intensity for said radial magnetic flux leakage present at the second point.

13. The method according to claim 9, wherein:
said magnetic field intensity value is an amplitude of frequency component of said magnetic field intensity.

14. The method according to claim 10, wherein:
said magnetic field intensity value is an amplitude of frequency component of said magnetic field intensity.

15. A combination, including:
a mobile phone; and
a system for condition monitoring electric machine, including:
a portable unit, being adapted for free movement around said electric machine;
a magnetic field sensor, being adapted for measuring magnetic field intensity at at least one of a plurality points of a path of said free movement;
a processing unit, being adapted for receiving at least one corresponding magnetic field intensity signal from said magnetic field sensor, comparing at least one magnetic field intensity value to at least one corresponding expected value, and determining, based on the comparison, if a fault is present in the electric machine;
wherein:
said magnetic field sensor and said processing unit are integrated into said portable unit;
a first point of said plurality of points of said path of said free movement is located in area where an axial magnetic flux leakage is present around said electric machine;
a second point of said plurality points of said path of said free movement is located in area where a radial magnetic flux leakage is present around said electric machine;
said portable unit is adapted to move to said first point;
said magnetic field sensor is adapted to measure the magnetic field intensity for said axial magnetic flux leakage present at the first point;
said portable unit is adapted to move to said second point;
said magnetic field sensor is adapted to measure the magnetic field intensity for said radial magnetic flux leakage present at the second point;
said processing unit is adapted for comparing said magnetic field intensity signals for said axial magnetic flux leakage and said radial magnetic flux leakage and determining a type of said fault; and
further wherein said system for condition monitoring the electric machine is within the mobile phone.

* * * * *